United States Patent
Isomoto et al.

(10) Patent No.: US 8,629,468 B2
(45) Date of Patent: Jan. 14, 2014

(54) METHOD FOR MANUFACTURING LIGHT EMITTING DEVICE AND LIGHT EMITTING DEVICE

(75) Inventors: Kenji Isomoto, Fukuoka-ken (JP); Chisato Furukawa, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 637 days.

(21) Appl. No.: 12/690,464

(22) Filed: Jan. 20, 2010

(65) Prior Publication Data
US 2010/0237366 A1 Sep. 23, 2010

(30) Foreign Application Priority Data

Mar. 17, 2009 (JP) .................................. 2009-064651

(51) Int. Cl.
*H01L 33/00* (2010.01)

(52) U.S. Cl.
USPC ................ 257/94; 257/13; 257/85; 257/102; 257/E21.09; 257/E33.023

(58) Field of Classification Search
None
See application file for complete search history.

(56) References Cited

U.S. PATENT DOCUMENTS

| | | | |
|---|---|---|---|
| 6,005,258 A * | 12/1999 | Manabe et al. | 257/13 |
| 6,465,809 B1 | 10/2002 | Furukawa et al. | |
| 6,815,312 B2 | 11/2004 | Furukawa et al. | |
| 7,217,635 B2 | 5/2007 | Furukawa et al. | |
| 7,364,982 B2 | 4/2008 | Furukawa et al. | |
| 2002/0036296 A1* | 3/2002 | Akaike et al. | 257/102 |
| 2002/0050601 A1* | 5/2002 | Saeki et al. | 257/103 |
| 2002/0185648 A1* | 12/2002 | Furukawa et al. | 257/79 |
| 2008/0308827 A1 | 12/2008 | Furukawa et al. | |
| 2010/0084669 A1 | 4/2010 | Furukawa et al. | |

FOREIGN PATENT DOCUMENTS

| | | |
|---|---|---|
| JP | 56-024985 | 3/1981 |
| JP | 62-119191 | 5/1987 |
| JP | 05-037018 | 2/1993 |
| JP | 11-116373 | 4/1999 |
| JP | 2002-111052 | 4/2002 |
| JP | 2005-005345 | 1/2005 |
| JP | 2007-123435 | 5/2007 |
| JP | 2008-251569 | 10/2008 |
| JP | 2008252151 | 10/2008 |
| JP | 201092965 | 4/2010 |

OTHER PUBLICATIONS

Japanese Office Action for Japanese Patent Application No. 2009-064651 Issued on Jul. 25, 2011.
Japanese Office Action for Japanese Application No. 2009-064651 issued on Apr. 5, 2012.
Japanese Decision of Refusal for Japanese Patent Application No. 2009-064651 Issued on Jan. 11, 2013.
Taiwanese Office Action for Taiwanese Application No. 098146286 mailed on Jan. 24, 2013.

* cited by examiner

*Primary Examiner* — Minh-Loan T Tran
*Assistant Examiner* — Fazli Erdem
(74) *Attorney, Agent, or Firm* — White & Case LLP

(57) ABSTRACT

A method for manufacturing a light emitting device, includes: preparing a first substrate by slicing a single crystal ingot pulled in a pulling direction tilted with respect to a first plane orientation, the slicing being in a direction substantially perpendicular to the pulling direction; preparing a second substrate including a major surface having a plane orientation substantially parallel to a plane orientation of a major surface of the first substrate; growing a stacked unit as a crystal on the major surface of the second substrate, the stacked unit including a light emitting layer; and removing the second substrate after bonding the stacked unit and the major surface of the first substrate by heating them in a joined state. A plane orientation of the major surface of the first substrate and a plane orientation of the major surface of the second substrate are one or another selected from a plane tilted from a (100) plane toward a [011] direction and a plane tilted from a (−100) plane toward a [0-1-1] direction, respectively.

4 Claims, 7 Drawing Sheets

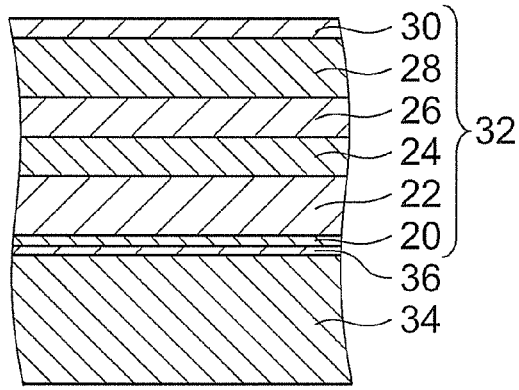
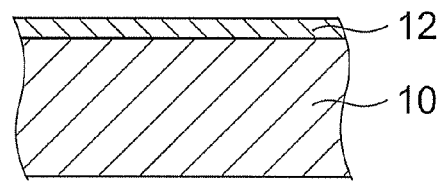
FIG. 2A
FIG. 2B
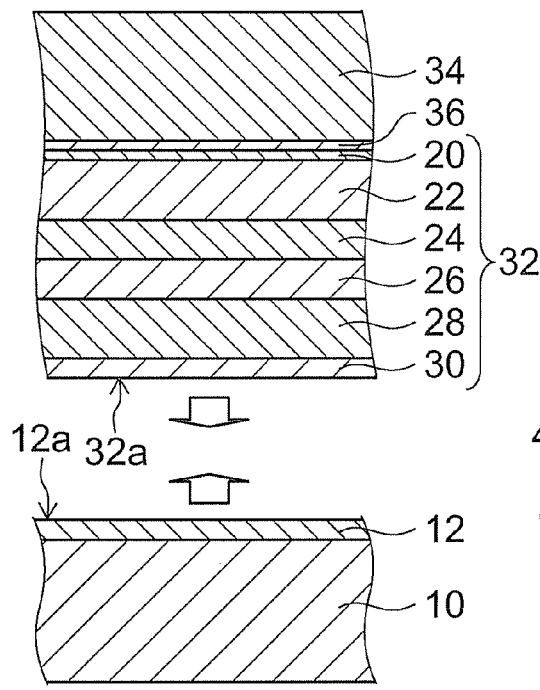
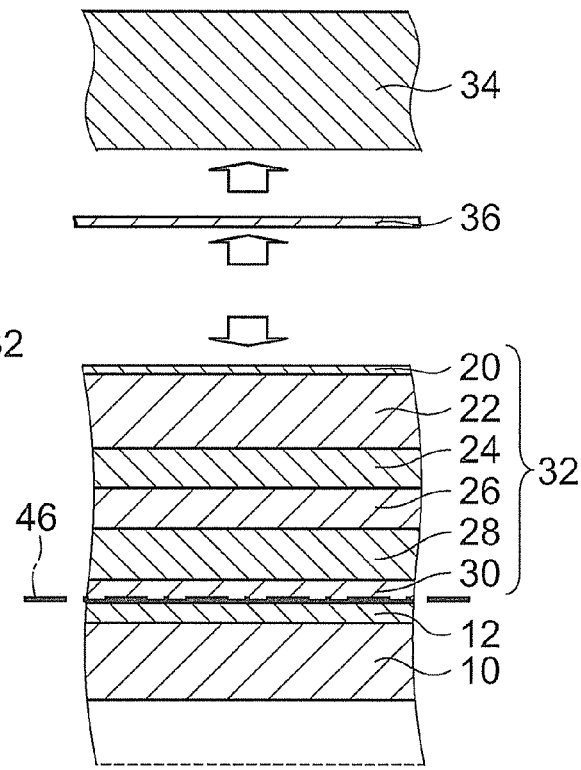
FIG. 2C
FIG. 2D $V_F$ (V)
- 2.360 <
- 2.320 — 2.359
- 2.280 — 2.319
- 2.240 — 2.279
- < 2.239

METHOD FOR MANUFACTURING LIGHT EMITTING DEVICE AND LIGHT EMITTING DEVICE

CROSS-REFERENCE TO RELATED APPLICATIONS

This application is based upon and claims the benefit of priority from the prior Japanese Patent Application No. 2009-064651, filed on Mar. 17, 2009; the entire contents of which are incorporated herein by reference.

BACKGROUND OF THE INVENTION

1. Field of the Invention

The invention relates to a method for manufacturing a light emitting device and a light emitting device.

2. Background Art

High-luminance light emitting devices having reduced light absorption by substrates have been obtained by growing a stacked unit as a crystal including a light emitting layer on a GaAs substrate, bonding to a transparent substrate made of GaP and the like, and subsequently removing the GaAs substrate.

In the case where an InGaAlP semiconductor is stacked on a GaAs substrate, it is easy to increase the doping efficiency to the p-type layers and suppress natural super lattices by using, for example, a substrate tilted from a (100) plane toward a [011] direction or a [01-1] direction.

Further, by matching the tilt of a GaP substrate to be bonded with the tilt of the GaAs substrate, a uniform bonding interface is provided, and it is easy to improve the electrical characteristics. Generally, the GaP substrate is formed by growing a crystal with a plane orientation of (100) or (111) using the LEC (Liquid Encapsulated Czochralski) method and tilting the crystal to the desired angle during the slicing process. In such a case, characteristic defects undesirably increase in the wafers sliced at a tilt for regions proximal to the seed portion and the tail portion because the doped impurities segregate from the seed side toward the tail side of the ingot.

One example discusses technology in which a substrate and a light emitting device configured for bonding are stably and closely adhered to an epitaxial growth layer formed on a substrate (JP-A 2008-252151 (Kokai)). In this example, a first epitaxial layer including an activation layer is formed on a first substrate. A second epitaxial layer is formed on a second substrate and integrally bonded to the first epitaxial layer. In the bonding process, a major surface of the first substrate predominantly exhibiting one selected from a (111) A plane and a (111) B plane is bonded to a major surface of the second substrate predominantly exhibiting the other selected from the (111) A plane and the (111) B plane.

However, it can be said that such technology does not sufficiently reduce fluctuation of characteristic distributions over the wafer after the bonding.

SUMMARY OF THE INVENTION

According to an aspect of the invention, there is provided a method for manufacturing a light emitting device, including: preparing a first substrate by slicing a single crystal ingot pulled in a pulling direction tilted with respect to a first plane orientation, the slicing being in a direction substantially perpendicular to the pulling direction; preparing a second substrate including a major surface having a plane orientation substantially parallel to a plane orientation of a major surface of the first substrate; growing a stacked unit as a crystal on the major surface of the second substrate, the stacked unit including a light emitting layer; and removing the second substrate after bonding the stacked unit and the major surface of the first substrate by heating them in a joined state, a plane orientation of the major surface of the first substrate being one selected from a plane tilted from a (100) plane toward a [011] direction and a plane tilted from a (−100) plane toward a [0-1-1] direction, a plane orientation of the major surface of the second substrate being the other selected from the plane tilted from the (100) plane toward the [011] direction and the plane tilted from the (−100) plane toward the [0-1-1] direction.

According to another aspect of the invention, there is provided a light emitting device, including: a substrate sliced from a single crystal ingot pulled in a pulling direction tilted with respect to a first plane orientation, the slicing being in a direction substantially perpendicular to the pulling direction, the substrate being doped with Zn and with Si having a concentration lower than a concentration of the Zn; and a stacked unit including a light emitting layer, a major surface of the stacked unit having a plane orientation substantially parallel to a plane orientation of a major surface of the substrate and being bonded to the major surface of the substrate, the plane orientation of the major surface of the stacked unit being one selected from a plane tilted from a (100) plane toward a [011] direction and a plane tilted from (−100) toward a [0-1-1] direction, the plane orientation of the major surface of the substrate being another selected from the plane tilted from the (100) plane toward the [011] direction and the plane tilted from (−100) toward the [0-1-1] direction, the substrate being able to transmit light emitted by the light emitting layer.

According to still another aspect of the invention, there is provided a light emitting device, including: a substrate having a major surface, an etch pit row occurring in a direction substantially perpendicular to the major surface; and a stacked unit including a light emitting layer, a major surface of the stacked unit having a plane orientation substantially parallel to a plane orientation of the major surface of the substrate and being bonded to the major surface of the substrate, the plane orientation of the major surface of the stacked unit being one selected from a plane tilted from a (100) plane toward a [011] direction and a plane tilted from (−100) toward a [0-1-1] direction, the plane orientation of the major surface of the substrate being another selected from the plane tilted from the (100) plane toward the [011] direction and the plane tilted from (−100) toward the [0-1-1] direction, the substrate being able to transmit light emitted by the light emitting layer.

BRIEF DESCRIPTION OF THE DRAWINGS

FIGS. 2A to 2D are cross-sectional views of processes of a method for manufacturing the light emitting device according to the embodiment;

DETAILED DESCRIPTION OF THE INVENTION

Embodiments of the invention will now be described with reference to the drawings.

Figure 1:
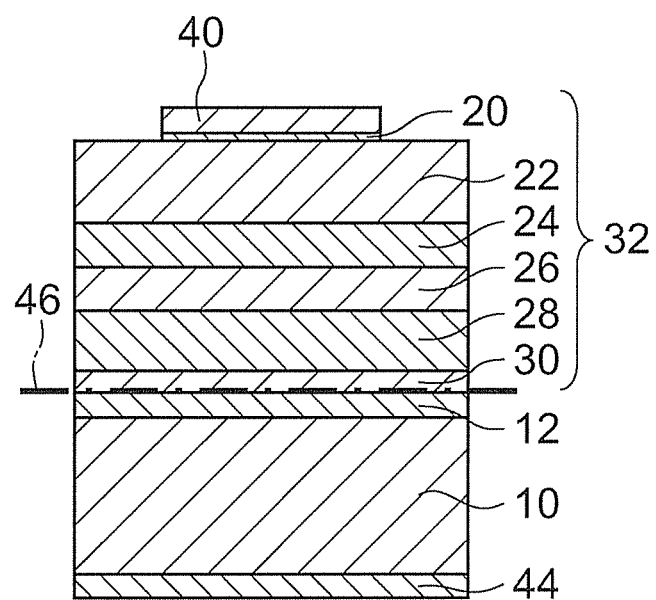
FIG. 1 is a schematic cross-sectional view of a light emitting device according to a first embodiment.

FIG. 1 is a schematic cross-sectional view of a light emitting device according to a first embodiment of the invention.

A bonding layer 12 made of p-type GaP and the like is grown as a crystal on a first tilted substrate 10 made of p-type GaP and the like. On the other hand, a stacked unit 32 is formed of a contact layer 20 made of n-type GaAs and the like, a current diffusion layer 22 made of n-type InGaAlP, a clad layer 24 made of n-type InGaAlP, a light emitting layer 26 made of InGaAlP, a clad layer 28 made of p-type InGaAlP, and a bonding layer 30 made of p-type InGaAlP. The conductivity types are not limited thereto. For example, an n-type GaP substrate may be used, and the conductivity types of the stacked unit may be reversed.

In the specification, "tilted substrate" refers to a substrate having a plane orientation of the major surface thereof shifted from a low-order crystal plane such as (100), (110), and (111).

In the specification, "InGaAlP" refers to a compound semiconductor material represented by the compositional formula $In_x(Ga_yAl_{1-y})_{1-x}P$ and includes materials doped with impurity elements to control the conductivity, where $0 \le x \le 1$ and $0 \le y \le 1$.

The bonding layer 30 of the stacked unit 32 is bonded to the bonding layer 12 provided on the tilted substrate 10 at a bonding interface 46. An n-side electrode 40 made of AuGe and the like is provided on the contact layer 20 with substantially the same size. A p-side electrode 44 made of AuZn and the like is provided on the bottom face side of the tilted substrate 10. Thus, the light emitting layer 26 can emit visible light in the green to red wavelength range by injecting a current in the vertical direction. Although the tilted substrate 10 is not limited to being transparent, it is more favorable to be transparent because the substrate absorbs less of the light emitted by the light emitting layer 26, and high power can be emitted to the outside.

Although depending on the light emission wavelength, AlGaAs, AlAs, and the like may be used as the transparent tilted substrate 10 made of group III-V elements. AlGaAs and GaAs may be used as the stacked unit 32.

The stacked unit 32 is grown as a crystal on a second tilted substrate having a first tilt angle toward, for example, the [011] direction from the (100) plane orientation. It is favorable to perform crystal growth on a tilted substrate because impurity control such as increasing the impurity doped rate and increasing the concentration is easy and control of the light emission wavelength is easy. In the case where an InGaAlP material is grown as a crystal on a GaAs substrate and the like, it is favorable that the tilt angle is at least several degrees, and more favorably about 15 degrees. Crystal growth becomes difficult when the tilt angle is too large.

On the other hand, the tilted substrate 10 has a second tilt angle toward, for example, the [0-1-1] direction from the (-100) plane orientation. The bonding layer 12 grown as a crystal on the tilted substrate 10 has substantially the same tilt angle. It is unfavorable for the deviation between the first tilt angle and the second tilt angle to increase because the crystallinity at the interface is disturbed and the interface resistance increases. In other words, it is favorable that the deviation between the tilt angles is small, and it is more favorable to be less than 1 degree. The deviation between the tilt angles indicates a deviation between the plane orientations. In the specification, "substantially parallel plane orientations" refers to the deviation between the plane orientations being less than 1 degree.

In the case where the tilted substrate 10 and the stacked unit 32 are bonded in the wafer-joined state, the bonding is possible without a bonding layer therebetween. However, materials having different types can be bonded more reliably via the bonding layer 12.

FIGS. 2A to 2D are cross-sectional views of processes of a method for manufacturing the light emitting device according to this embodiment.

Although a second tilted substrate 34 made of n-type GaAs and the like doped with Si and the like is taken to be sliced from a single crystal ingot grown using an on-axis seed, the second tilted substrate 34 may be sliced from a single crystal ingot using an off-axis seed.

The second tilted substrate 34 has a major surface tilted, for example, about 15 degrees toward the [011] direction from the (100) plane orientation. The stacked unit 32 is grown as a crystal on the major surface of the second tilted substrate 34 starting with a bonding layer 36 and the contact layer 20. The crystal growth may be performed using, for example, MOCVD (Metal Organic Chemical Vapor Deposition) or MBE (Molecular Beam Epitaxy). In the case of MOCVD, the second tilted substrate 34 is placed on a susceptor in the apparatus and heated to about 730° C. in an $AsH_3$ atmosphere.

The bonding layer 36 made of Si-doped InGaP is formed by switching the $AsH_3$ (arsine) to $PH_3$ (phosphine) and directly thereafter supplying TMG (Trimethyl Gallium), TMI (Trimethyl Indium), and $SiH_4$ (monosilane).

Continuing, the contact layer 20 made of Si-doped GaAs is formed by switching the $PH_3$ to $AsH_3$ and directly thereafter supplying TMG and $SiH_4$.

Then, the current diffusion layer 22 made of Si-doped InGaAlP is formed by switching the $AsH_3$ to $PH_3$ and directly thereafter supplying TMG, TMI, TMA, and $SiH_4$.

Continuing, the light emitting layer 26, the clad layer 28, and the bonding layer 30 can be given the p-type conductivity by doping with Zn using DMZ (Dimethyl Zinc). After thus forming the stacked unit 32, the temperature is reduced in the $PH_3$ atmosphere; the supply of the $PH_3$ is stopped when room temperature is reached; the atmosphere is replaced with nitrogen gas; and the crystal growing process is completed (FIG. 2A).

Thus, by using MOCVD, it is easy to form the light emitting layer 26 with a MQW (Multiple Quantum Well) structure. By having a MQW structure, it is easy to control the light emission wavelength, reduce the operation current, etc.

On the other hand, a p-type GaP single crystal ingot, for example, is pulled with a plane orientation tilted about 15 degrees toward the [0-1-1] direction from the (-100) plane using the LEC method. In other words, the pulling direction of the single crystal ingot is a direction tilted about 15 degrees from the (-100) plane toward the [0-1-1] direction. This direction can be controlled by the plane orientation of the seed crystal, which determines the crystal orientation of the single crystal ingot. That is, the single crystal ingot having such a crystal orientation can be grown by pulling in a direction tilted 15 degrees from the (-100) plane of the seed crystal toward the [0-1-1] direction.

In such a case, the desired carrier concentration is possible by controlling the Zn and Si doping amounts.

By thinly cutting (slicing) the single crystal ingot in the direction substantially orthogonal to the pulling direction, the first tilted substrate 10 can be obtained having a major surface with a plane orientation tilted about 15 degrees from the (-100) plane toward the [0-1-1] direction. The first tilted substrate 10 had, for example, a Zn concentration of about $8.0 \times 10^{17}$ cm$^{-3}$ and a Si concentration of $1.0 \times 10^{17}$ cm$^{-3}$ at the center of the substrate (having a size of 5 mm by 5 mm). As a result of measuring by the eddy current method, the p-type carrier concentration was about $7.5 \times 10^{17}$ cm$^{-3}$.

The bonding layer 12 made of p-type GaP can be formed by placing the first tilted substrate 10 on a susceptor in an MOCVD apparatus, increasing the temperature to 730° C. in a PH$_3$ atmosphere, and supplying TMG and DMZ (FIG. 2B).

The stacked structures illustrated in FIG. 2A and FIG. 2B are cleaned using an ultrasonic cleaning apparatus and the like. Subsequently, the stacked structures are bonded by heating them at about 200° C. in the wafer-joined state (FIG. 2C). In such a case, a major surface 12a of the bonding layer 12 on the first tilted substrate 10 side is bonded to a major surface 32a of the stacked unit 32. Subsequently, a heat treatment process is performed at about 400° C. in a hydrogen atmosphere for 60 minutes, and the bonding process is completed.

Continuing, the second tilted substrate 34 made of GaAs can be removed by immersing the bonded structure in a mixed solution (25° C.) having a proportion of aqueous ammonia: aqueous hydrogen peroxide of 1:15 for, for example, 60 minutes. Subsequently, the bonding strength between the stacked unit 32 and the bonding layer 12 on the first tilted substrate 10 can be further increased by performing heat treatment at 700° C. in a hydrogen atmosphere for 60 minutes. Then, the bonding layer 36 can be removed by immersing in hydrochloride.

The first tilted substrate 10 is polished as illustrated by the broken line to a thickness of, for example, 200 μm and the like (FIG. 2D). Then, the p-side electrode 44 and the n-side electrode 40 are formed, and a heat treatment process is performed to form ohmic contacts. The light emitting device of FIG. 1 can be obtained by dicing.

Figure 3A:
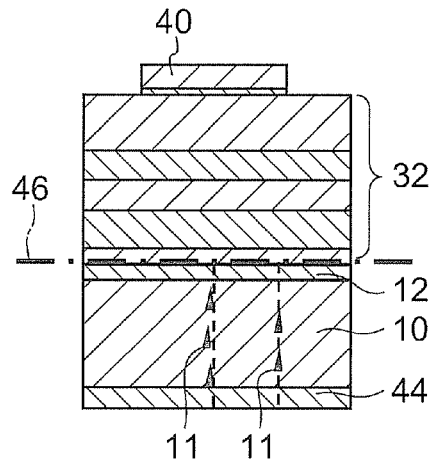
FIGS. 3A to 3E are schematic views illustrating a tilted substrate.
Figure 3B:
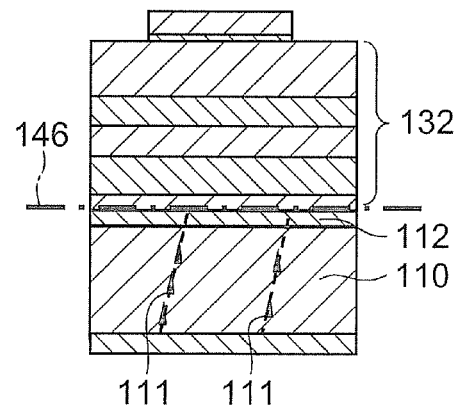
Figure 3C:
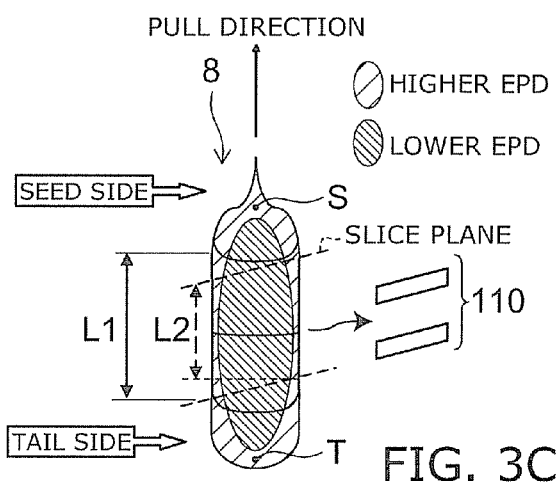
Figure 3D:
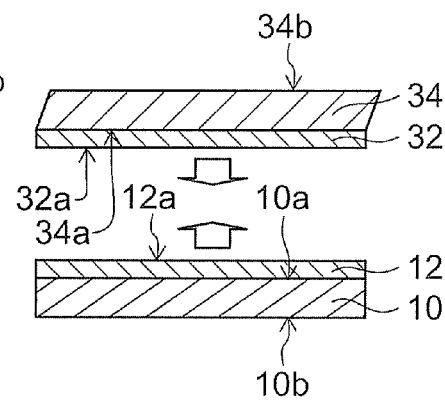
Figure 3E:
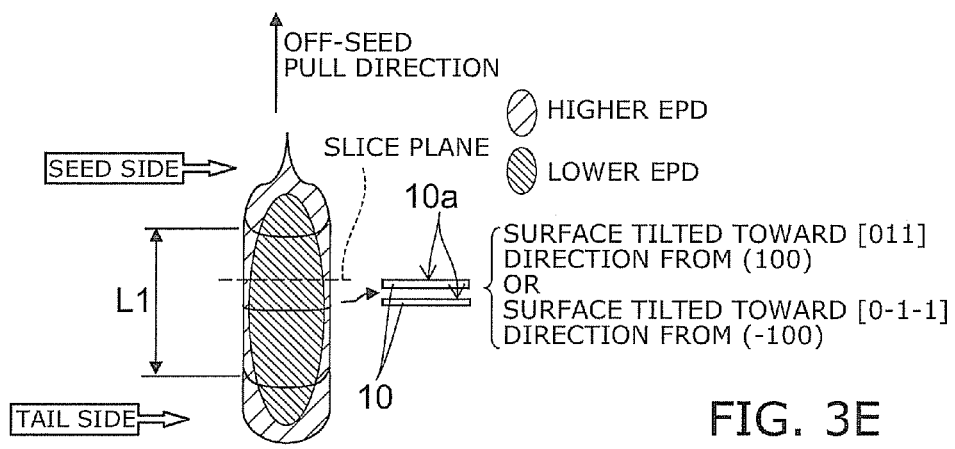

FIG. 3A is a cross-sectional view of this embodiment. FIG. 3B is a cross-sectional view of a comparative example. FIG. 3C is a conceptual view illustrating a single crystal. FIG. 3D is a cross-sectional view illustrating the bonding surfaces. FIG. 3E is a conceptual view of a single crystal according to this embodiment.

The light emitting device of this embodiment of FIG. 3A uses the substrate 10 obtained from a single crystal ingot grown using an off-axis seed.

On the other hand, the light emitting device of the comparative example of FIG. 3B uses a tilted substrate 110 sliced from a single crystal ingot grown using a seed of, for example, the on-axis plane of a (100) plane or a (111) plane, where the slicing is tilted the desired angle toward the [0-1-1] direction from (-100) (FIG. 3C). A bonding layer 112 is provided on the tilted substrate 110. A stacked unit 132 is bonded thereto at a bonding interface 146.

In the case where a GaP single crystal ingot is grown, the etch pit density (EPD) easily increases at the seed side, the tail side, and the region proximal to the outer edge of an ingot 8. Therefore, it is easy to increase the chip yield of the wafer by using a region L1 in the central portion of the single crystal ingot 8 where the single crystal ingot 8 has a relatively low etch pit density. However, in the case of tilted slicing, although the chip yield can be kept high by using the region L1 and avoiding the seed side and the tail side, the usable region decreases to L2. Also, the Zn concentration easily increases in the tail region.

As illustrated in FIG. 3E, this embodiment uses the first tilted substrate 10 sliced from a single crystal ingot pulled in a direction tilted with respect to the (100) plane orientation, where the slicing is in a direction substantially perpendicular to the pulling direction. Thus, the wafer yield can be increased because the usable region of the single crystal ingot can be increased to L1. In such a case, as illustrated in FIG. 3D, the plane orientation of the major surface 12a of the bonding layer 12 provided on the first tilted substrate 10 substantially matches the plane orientation of a major surface 10a of the first tilted substrate 10. Also, the plane orientation of the major surface 32a of the stacked unit 32 substantially matches the plane orientation of a major surface 34a of the second tilted substrate 34.

It is favorable that the plane orientation of the major surface 10a of the first tilted substrate 10 and the plane orientation of the major surface 12a of the bonding layer 12 are one selected from a plane orientation tilted from the (100) plane toward the [011] direction and a plane orientation tilted from (-100) toward the [0-1-1] direction. It is favorable that the plane orientation of the major surface 32a of the stacked unit 32 is the other selected from the plane orientation tilted from the (100) plane toward the [011] direction and the plane orientation tilted from (-100) toward the [0-1-1] direction. Such a combination makes it easy to improve both the doping controllability and the light emission characteristics.

Generally, in a group III-V compound semiconductor such as GaP and GaAs, the elements appearing at the surfaces may differ for the surface on the seed side and the surface on the tail side by the angle at which the substrate is sliced from the single crystal ingot. Further, the surface of the different substrate or the surface of the layer grown thereupon has substantially the same plane orientation as that of the substrate. In other words, if one surface is a surface with a group III tendency, the other surface is a surface with a group V tendency. For example, mutually different surfaces appear at the major surface 10a and the other surface 10b of the first tilted substrate 10 illustrated in FIG. 3D. For the second tilted substrate 34 as well, different surfaces appear at the major surface 34a and the other surface 34b.

By bonding such mutually different surfaces in a joined state, the ratio of group III and group V elements can be maintained substantially constant, dangling bonds can be reduced, the entire surfaces of the substrates can be bonded uniformly, and fluctuation of the interface resistance can be reduced.

Etch pits were observed by the following method. First, the wafer is cleaved parallel to the orientation flat. The cross section thereof is the (01-1) plane. Then, the wafer is immersed in a mixture solution of hydrofluoric acid, sulfate, and aqueous hydrogen peroxide; and the major surface and the (01-1) plane thereof were observed by a differential interference microscope. No substantial difference was observed for the etch pit densities of the major surfaces of the first tilted substrate 10 of FIG. 3A and the tilted substrate 110 of FIG. 3B. On the other hand, it was observed for the (01-1) plane that trigonal pyramid-shaped etch pit rows 11 of this embodiment of FIG. 3A were in a direction substantially perpendicular to the major surface 10a of the first tilted substrate 10, while etch pit rows 111 of the comparative example tended to be arranged along directions tilted with respect to a direction perpendicular to a major surface of the tilted substrate 110. Thus, it was ascertained that it is possible to know the pulling direction of the single crystal of the tilted substrate by observing the arrangement direction of the etch pits.

Figure 4A:
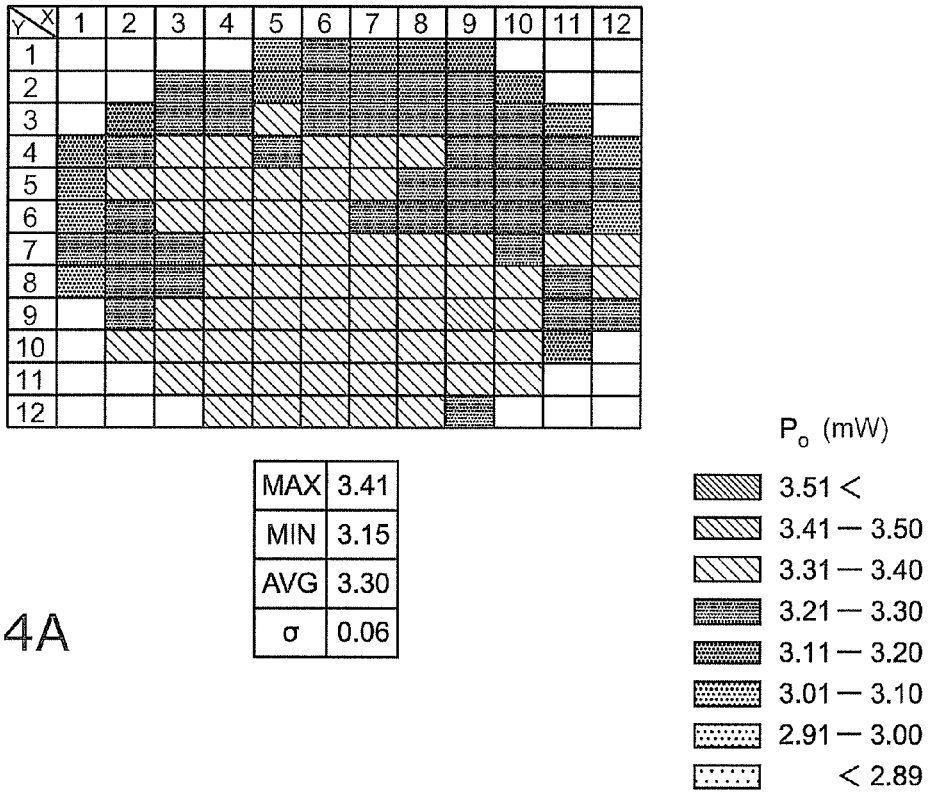
FIGS. 4A and 4B are the optical power distributions over the wafer surface.
Figure 4B:
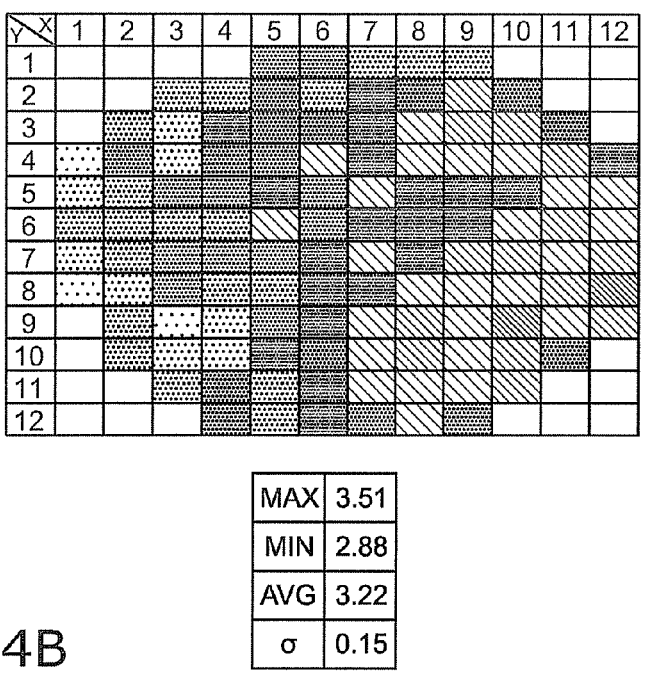

FIG. 4A illustrates the optical power distribution over the wafer surface of this embodiment. FIG. 4B illustrates the optical power distribution over the wafer surface of the comparative example. X and Y are mutually orthogonal relative position coordinates of the wafer surface. In both this embodiment and the comparative example, surfaces with a group III tendency are bonded to surfaces with a group V tendency.

According to SIMS (Secondary Ionization Mass Spectrometer) analysis, the Zn concentration at substantially the center of the 5 mm by 5 mm region of the wafer sliced from the ingot used in this embodiment was $8.0 \times 10^{17}$ cm$^{-3}$. As a result of measuring using the eddy current method, the p-type carrier concentration was about $7.5 \times 10^{17}$ cm$^{-3}$. As illustrated in FIG. 4A, an optical power Po of the light emitting device of this embodiment using this substrate had a maximum value of 3.41 mW, a minimum value of 3.15 mW, an average of 3.3 mW, and a standard deviation of 0.06 mW.

On the other hand, the substrate of the comparative example was sliced from an ingot using an on-axis seed pulled in a pulling orientation of [−100], where the slicing was tilted 15 degrees toward the [0-1-1] direction from (−100). The Zn concentration at substantially the center of the 5 mm by 5 mm region sliced from the ingot was $7.8 \times 10^{17}$ cm$^{-3}$, and the Si concentration was $1.0 \times 10^{16}$ cm$^{-3}$. It may be considered that Si was detected in this comparative example even though Si doping was not performed because of mixing from the quartz components used in the growing process (the substrate was sliced from a region proximal to the seed side). As a result of measuring using the eddy current method, the p-type carrier concentration was $7.5 \times 10^{17}$ cm$^{-3}$.

As illustrated in FIG. 4B, the optical power Po of the light emitting device of the comparative example using this substrate had a maximum value of 3.51 mW, a minimum value of 2.88 mW, an average of 3.22 mW, and a standard deviation of 0.15 mW. In other words, the fluctuation of the optical power Po of the comparative example was large, and the standard deviation thereof was about 2.5 times that of this embodiment.

Figure 5A:
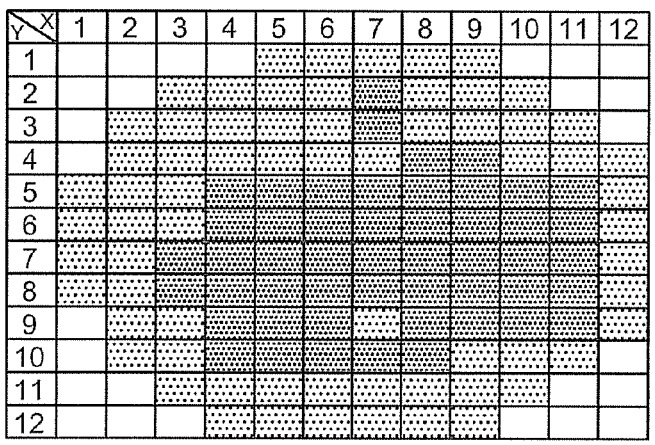
FIGS. 5A and 5B are the operating voltage distributions over the wafer surface.
Figure 5B:
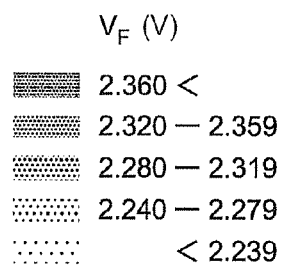
Figure 5B:
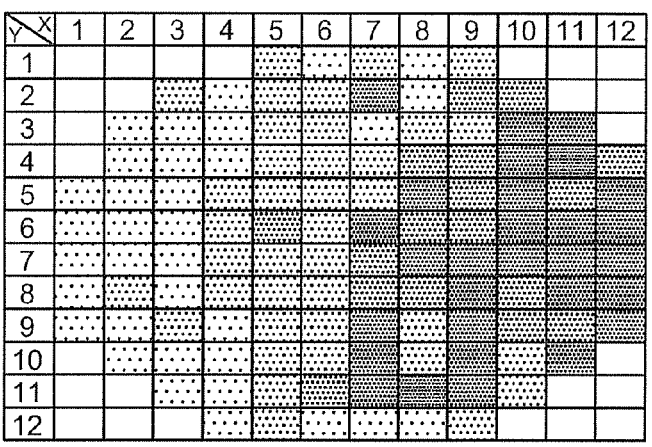

FIG. 5A illustrates the operating voltage distribution over the wafer surface for a constant operating current of this embodiment. FIG. 5B illustrates the operating voltage distribution over the wafer surface for a constant operating current of the comparative example. X and Y are mutually orthogonal relative position coordinates of the wafer surface.

As illustrated in FIG. 5A, an operating voltage $V_F$ of this embodiment had a maximum value of 2.306 V, a minimum value of 2.239 V, an average of 2.273 V, and a standard deviation of 0.019 V. On the other hand, the operating voltage $V_F$ of the comparative example of FIG. 5B had a maximum value of 2.375 V, a minimum value of 2.189 V, an average of 2.270 V, and a standard deviation of 0.049 V. In other words, the fluctuation of the operating voltage of the comparative example was large, and the standard deviation thereof was about 2.6 times that of this embodiment.

The fluctuation of the interface resistance of the bonding interface 46 between the first tilted substrate 10 and the stacked unit 32 of this embodiment was smaller than the fluctuation of the interface resistance of the comparative example. Therefore, in this embodiment, the operating voltage $V_F$ can be made more uniform over the entire surface of the wafer, and the fluctuation of the optical power Po also can be reduced.

Even in the case where the single crystal ingot grown using an off-axis seed was n-type GaP, it was possible to reduce the fluctuation of the operating voltage and the optical power by bonding the surfaces having a group III tendency to the surfaces having a group V tendency.

In other words, in the manufacturing method illustrated in FIGS. 2A to 2D, the characteristic fluctuation can be reduced as illustrated in FIGS. 4A and 4B and FIGS. 5A and 5B; the chip yield can be improved; the suitability for mass production can be increased; and as a result, it is easy to reduce costs.

Figure 6A:
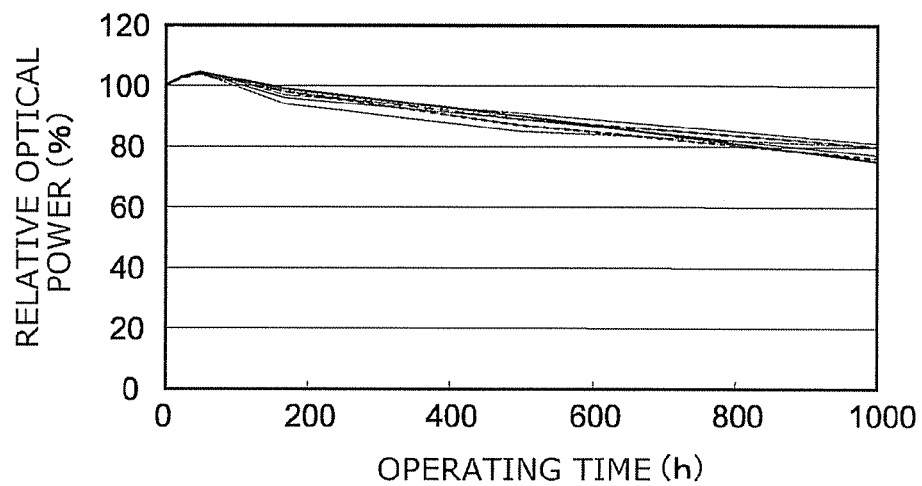
FIGS. 6A and 6B are graphs illustrating the optical power fluctuation according to a second embodiment.
Figure 6B:
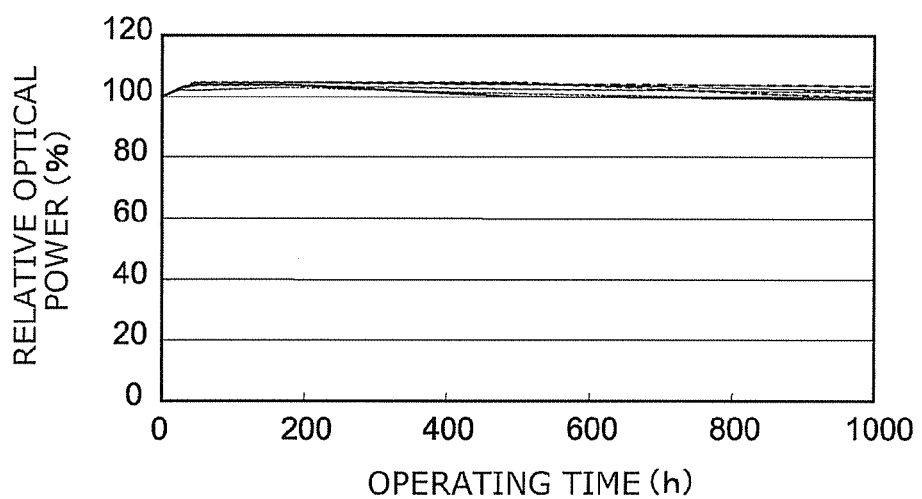

FIG. 6A is a graph illustrating the optical power fluctuation of the comparative example. FIG. 6B is a graph illustrating the optical power fluctuation of a light emitting device according to a second embodiment. In FIGS. 6A and 6B, the relative optical power (%) is plotted on the vertical axis, and the operating time (h) is plotted on the horizontal axis.

Although the stacked unit of this embodiment has the same configuration as that of the first embodiment illustrated in FIG. 1, the doping of the first tilted substrate 10 is different.

The comparative example of FIG. 6A uses a tilted substrate sliced from the tail side of a single crystal ingot (proximal to a region T of FIG. 3C) grown using an on-axis seed. Normally, many crystal defects occur, and Zn diffusion is easily promoted on the tail side. Two settings of $1.5 \times 10^{18}$ cm$^{-3}$ and $2.0 \times 10^{18}$ cm$^{-3}$ for the Zn concentration are used.

In the substrate sliced proximally to the tail, little auto-doping of Si from the quartz components used in the growing process existed, and actual levels were below the detection limitations of the SIMS. In the case of the comparative example, the optical power after 1,000 hours of operation was in the range of 75 to 81% of the initial value. No substantial difference was seen for the two concentrations of Zn.

Conversely, the inventors obtained the knowledge that the optical power decreased little for light emitting devices using tilted substrates from the seed side indicated by a region S of FIG. 3C even for high etch pit densities. It may be considered that Si has an effect of suppressing the diffusion of Zn on the seed side because a Si concentration of about $1 \times 10^{16}$ cm$^{-3}$ is detected even though Si doping is not performed.

Based on this knowledge, the first tilted substrate 10 of the second embodiment was doped with Zn and with Si having a concentration lower than the concentration of Zn. In other words, a substrate having a Zn concentration setting of $1.5 \times 10^{18}$ cm$^{-3}$ and a Si concentration setting of $1.2 \times 10^{16}$ cm$^{-3}$ and a substrate having a Zn concentration setting of $2.0 \times 10^{18}$ cm$^{-3}$ and a Si concentration setting of $1.4 \times 10^{16}$ cm$^{-3}$ are used. As a result, as illustrated in FIG. 6B, the fluctuation of the optical power Po after 1,000 hours of operation was within ±2% of the initial value. No substantial difference was seen for the two concentration settings.

Figure 7:
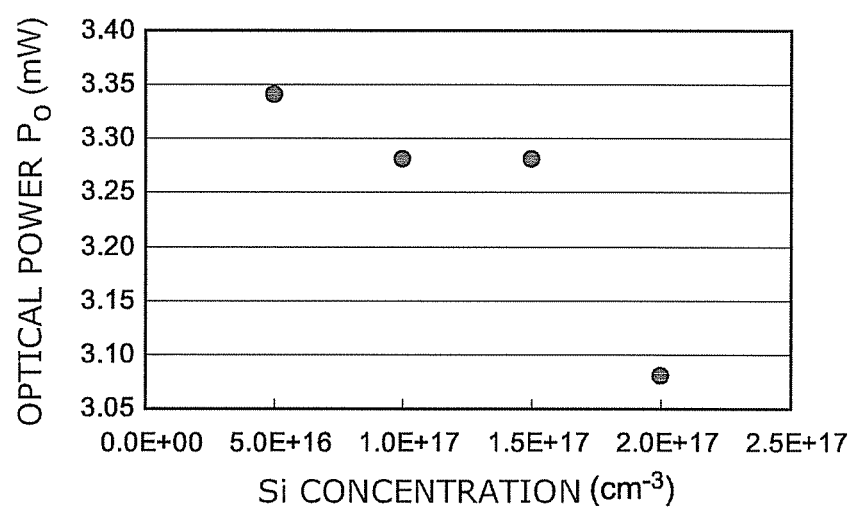
FIG. 7 is a graph illustrating the dependency of the optical power on the Si concentration.

FIG. 7 is a graph illustrating the dependency of the optical power Po on the Si concentration. The initial relative luminance is plotted on the vertical axis, and the Si concentration (cm$^{-3}$) is plotted on the horizontal axis.

The Zn concentration was set at $7.0 \times 10^{17}$ cm$^{-3}$ and the Si concentration was set at $5.0 \times 10^{16}$ cm$^{-3}$, $1.0 \times 10^{17}$ cm$^{-3}$, $1.5 \times 10^{17}$ cm$^{-3}$, and $2.0 \times 10^{17}$ cm$^{-3}$. The optical power Po (the luminance) increased as the Si concentration decreased and dropped steeply between $1.5 \times 10^{17}$ cm$^{-3}$ and $2.0 \times 10^{17}$ cm$^{-3}$. In other words, it is favorable that the Si concentration is not more than about $1.5 \times 10^{17}$ cm$^{-3}$. For each of the Si concentrations, the fluctuation of the optical power Po was within ±2% after 1,000 hours of operation. In other words, in the case where the Si concentration is higher than the auto-doping of the growing process of the single crystal ingot and not more than $1.5 \times 10^{17}$ cm$^{-3}$, it is easy to provide a light emitting device in which the optical power Po is maintained, a decrease of the optical power is suppressed, and the characteristic fluctuation over the wafer surface is suppressed.

According to the first and second embodiments, the fluctuation of the interface resistance is reduced, and light emitting devices can be provided having reduced fluctuation of the operating voltage $V_F$, the optical power Po, etc., over the wafer surface. Such light emitting devices may be applied widely to illumination apparatuses, display apparatuses, traffic signals, etc.

Hereinabove, exemplary embodiments of the invention are described with reference to the drawings. However, the invention is not limited to these exemplary embodiments. One skilled in the art may perform various design modifications to the material qualities, sizes, configurations, dispositions, etc., of single crystal ingots, substrates, stacked units, impurities such as acceptors and donors, etc., of the invention. Such design modifications are included in the scope of the invention to the extent that the purport of the invention is included.

The invention claimed is:

1. A light emitting device, comprising:
    a substrate having a major surface made of GaP and doped with Zn and with Si, a concentration of Si being lower than a concentration of the Zn, and not less than $1 \times 10^{16}$ cm$^{-3}$ and not more than $1.5 \times 10^{17}$ cm$^{-3}$; and
    a stacked unit including a light emitting layer and including $In_x(Ga_yAl_{1-y})_{1-x}P$, where $0 \leq x \leq 1$ and $0 \leq y \leq 1$,
    the substrate being able to transmit light emitted by the light emitting layer.

2. The device according to claim 1, wherein a conduction type of the substrate is p-type.

3. The device according to claim 1, further comprising a bonding layer provided between the substrate and stacked unit and made of $In_x(Ga_yAl_{1-y})_{1-x}P$, where $0 \leq x \leq 1$ and $0 \leq y \leq 1$.

4. The device according to claim 1, wherein the substrate has a plane orientation of the major surface shifted from a low-order crystal plane including (100), (110) and (111).

* * * * *